(12) United States Patent
Hau-Riege et al.

(10) Patent No.: US 7,451,411 B2
(45) Date of Patent: Nov. 11, 2008

(54) INTEGRATED CIRCUIT DESIGN SYSTEM

(75) Inventors: Christine Hau-Riege, Fremont, CA (US); Amit P. Marathe, Sunnyvale, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 113 days.

(21) Appl. No.: 11/475,675

(22) Filed: Jun. 26, 2006

(65) Prior Publication Data
US 2007/0300200 A1 Dec. 27, 2007

(51) Int. Cl.
*G06F 17/50* (2006.01)

(52) U.S. Cl. .................. 716/2; 716/1; 716/4; 716/5; 716/10; 716/13

(58) Field of Classification Search ............. 716/1–13
See application file for complete search history.

(56) References Cited

U.S. PATENT DOCUMENTS

| | | | |
|---|---|---|---|
| 5,439,731 A * | 8/1995 | Li et al. | 428/209 |
| 5,497,076 A * | 3/1996 | Kuo et al. | 324/158.1 |
| 5,737,580 A * | 4/1998 | Hathaway et al. | 716/12 |
| 6,880,139 B2 | 4/2005 | Mau et al. | |
| 6,927,080 B1 | 8/2005 | Nariman et al. | |
| 6,954,914 B2 | 10/2005 | Sundar et al. | |
| 2004/0061237 A1 | 4/2004 | Zhao et al. | |

OTHER PUBLICATIONS

Hau-Riege, "The effect of interlevel dielectric on the critical tensile stress to void nucleation for the reliability of Cu interconnects", Journal of Applied Physics, Oct. 2004, pp. 1-5, vol. 96, No. 7.
Hau-Riege, "The effect of low-K ILD on the electromigration reliability of Cu interconnects with different line lengths".
Blech, "Stress generation by electromigration", Applied Physics Letters, Aug. 1979, pp. 131-133, vol. 29, No. 3.

* cited by examiner

*Primary Examiner*—Sun J Lin
(74) *Attorney, Agent, or Firm*—Farjami & Farjami LLP

(57) ABSTRACT

The present invention provides an integrated circuit design system, comprising providing a design system in a computer system, providing a layout design tool coupled to the design system, wherein the layout design tool creates an interconnect structure to satisfy electromigration criteria, and manipulating a design database within the design system.

20 Claims, 3 Drawing Sheets

US 7,451,411 B2

INTEGRATED CIRCUIT DESIGN SYSTEM

TECHNICAL FIELD

The present invention relates generally to integrated circuit development systems, and more particularly to a system for predicting electromigration stresses in an integrated circuit development process.

BACKGROUND ART

With the ever increasing demand for more function designed into smaller spaces, process geometries have gotten dramatically smaller. This progress in technology has enabled the development of highly popular electronic devices, such as cell phones, hand held computers, personal GPS navigation systems, and personal music video players. Our social reliance on these innovations has put very stringent reliability requirements on the products that we select.

As device dimensions have continued to shrink, the packing density of the semiconductor devices, e.g. transistors, has increased. That is, ever increasing numbers of transistors or memory cells are located on the same plot space of a semiconductor substrate. As a result of this increased device density, the conductive metal lines and contacts or vias that connect these various devices have also been reduced in physical size, and they are also packed more closely together. In general, the resistance of a metal line is inversely proportional to the cross-sectional area of the metal line. Thus, all other things being equal, it is important that the cross-sectional area of the metal line be maintained above certain minimum levels such that the resistance of the metal line does not exceed allowable limits. Unanticipated increases in the resistance of a metal line may adversely impact device performance, e.g., a reduction in operating frequency, increased heat build-up, increased power consumption, etc.

Unfortunately, a phenomenon known as electromigration can adversely impact conductive metal lines in an integrated circuit product. In general, electromigration is a process whereby a conductive structure, such as a metal line, contact or via tends to degrade or become damaged, thereby resulting in a change in the physical characteristics, e.g., shape, size, etc., of the conductive structure. Typically, electromigration occurs when a current is passed through relatively long conductive structures. The current sets up an electrical field in the conductive structure that decreases from the input side to the output side of the conductive structure. The electric field thereby biases the movement of the metal atoms in the conductive structure. This electromigration phenomenon results in physical changes to the size and/or shape of the conductive structure. For example, in some cases, a void may form in the conductive structure. In a worst case scenario, electromigration can cause complete separation of the conductive structure. This electromigration phenomenon can occur on metals such as aluminum, copper, tungsten, titanium, etc.

In designing integrated circuit products, efforts are taken to reduce, eliminate or account for electromigration of conductive structures in integrated circuit products. Such efforts may include selecting appropriate materials, making conductive structures sufficiently large such that the effects of electromigration does not adversely impact the performance of the integrated circuit product over its useful life. To verify the integrity of current designs, devices are tested for thousands of hours under stress conditions, such as elevated temperature, voltage and humidity. The late discovery of a flawed design can be devastating to a product delivery schedule.

Thus, a need still remains for a system that will allow integrated circuit designers to predict the impact of electromigration on their design prior to manufacture. The demand for highly reliable and long life products make it is increasingly critical that answers be found to these problems. In view of the ever-increasing need to save costs and improve efficiencies, it is more and more critical that answers be found to these problems. Solutions to these problems have been long sought but prior developments have not taught or suggested any solutions and, thus, solutions to these problems have long eluded those skilled in the art.

DISCLOSURE OF THE INVENTION

The present invention provides an integrated circuit design system providing a design system in a computer system, providing a layout design tool coupled to the design system, wherein the layout design tool creates an interconnect structure to satisfy electromigration criteria, and manipulating a design database within the design system.

Certain embodiments of the invention have other aspects in addition to or in place of those mentioned or obvious from the above. The aspects will become apparent to those skilled in the art from a reading of the following detailed description when taken with reference to the accompanying drawings.

BEST MODE FOR CARRYING OUT THE INVENTION

Figure 1:
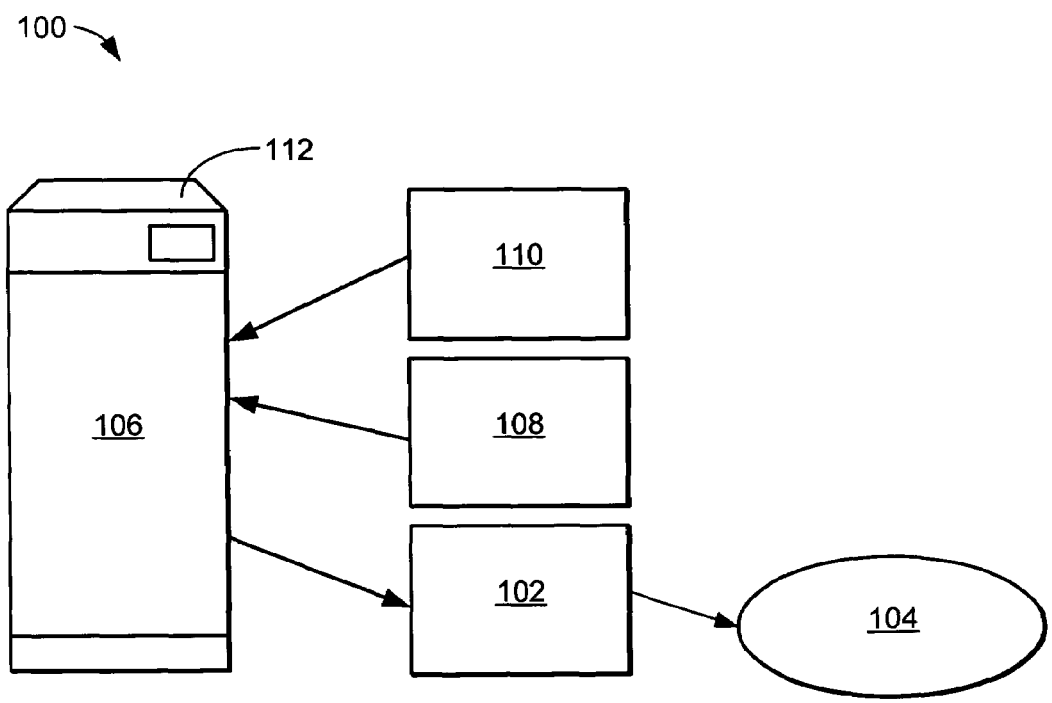
FIG. 1 is a block diagram of an integrated circuit design system in an embodiment of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail. Likewise, the drawings showing embodiments of the apparatus are semi-diagrammatic and not to scale and, particularly, some of the dimensions are for the clarity of presentation and are shown greatly exaggerated in the drawing FIGs. Also, where multiple embodiments are disclosed and described, having some features in common, for clarity and ease of illustration, description, and comprehension thereof, similar and like features one to another will ordinarily be described with like reference numerals.

The term "horizontal" as used herein is defined as a plane parallel to the conventional plane or surface of the substrate wafer, regardless of its orientation. The term "vertical" refers to a direction perpendicular to the horizontal as just defined. Terms, such as "on", "above", "below", "bottom", "top", "side" (as in "sidewall"), "higher", "lower", "upper", "over", and "under", are defined with respect to the horizontal plane. The term "processing" as used herein includes deposition of material or photoresist, patterning, exposure, development, etching, cleaning, and/or removal of the material or photoresist as required in forming a described structure.

Referring now to FIG. 1, therein is shown a block diagram of an integrated circuit design system 100 in an embodiment of the present invention. The block diagram of the integrated circuit design system 100 depicts a layout design tool 102, a target wafer 104, a design system 106, in a computer system 112, a design database 108 and a technology database 110. The technology database 110 contains detailed technology information about the interconnect system, such as adhesion energy of the copper/cap (Cu/cap) interface and Young's modulus of the interlayer dielectric. The design database 108 contains the netlist interconnect, physical location of the design blocks and operational characteristics, such as current drive, input capacitance and operational function. The design system 106, including the computer system 112, retrieves information from the design database 108 and the technology database 110.

The design system 106 manipulates the function and circuitry of the layout design tool 102 in order to form the appropriate interconnect structures that meet the electromigration requirements for the design. The output of the layout design tool 102 is applied to the target wafer 104 during the manufacturing process to fabricate a device, such as an integrated circuit. The layout design tool 102 provides an interconnect structure for the design that meets the electromigration life requirements for the desired device.

The layout design tool 102, circuitry and function, enables the design system 106 to interpret the design database 108 requirements. Each network of the design is analyzed based on the source and destination functions, in the design database 108 and the interconnect structure is provided based on the physical geometry of the design elements. The manipulation of the database 108 allows flexibility in adjusting interconnect elements to meet the electromigration design requirements. The adjustments are related to current density (j) and the length of the interconnect element (L).

The relationship defined in equation 1 is used to determine the critical dimensions of the interconnect element that will prevent electromigration failure during the useful life of the device being designed. The product of the critical current density (j) and the length of the interconnect element (L) defines the threshold at which a void or cavity will form in the interconnect structure.

$$jL_{crit} = \sigma_{crit} = \sqrt{\frac{A_{void}\gamma}{V_{relaxation}\xi}} \quad (1)$$

The critical stress ($\sigma_{crit}$) of the interconnect element is related to the area of a potential void ($A_{void}$), the Cu/cap interface energy per unit area ($\gamma$), the interconnect volume ($V_{relaxation}$) and the strain-energy proportionality constant ($\xi$) for the design technology. The layout design tool 102 accesses the technology constants from the technology database 110 and the layout variables from the design database 108 to implement an interconnect element that can meet the electromigration life requirements of the designed device.

The target wafer 104 is fabricated and benefits from the design of the interconnect structure that meets the electromigration design requirements on the first layout. The use of the layout design tool 102 may also alleviate the need to execute the normal electromigration testing which may consume in excess of 1000 hours.

Figure 2:
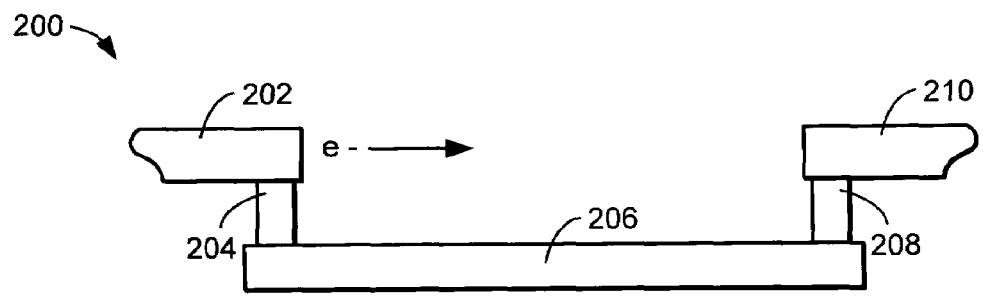
FIG. 2 is a cross-sectional view of an interconnect.

Referring now to FIG. 2, therein is shown a cross-sectional view of an interconnect structure 200. The cross-sectional view of the interconnect structure 200 depicts a source trace 202, a first via 204, an interconnect segment 206, a second via 208 and a destination trace 210. The source trace 202 is connected to a source device (not shown), such as a line driver or buffer. The first via 204 connects the source trace 202 to the interconnect segment 206. The first via 204 passes through a dielectric layer (not shown) in order to make the connection. This layout is an example only and it is understood that a more complex interconnect structure is more likely as most technologies currently support more than five metal interconnect layers.

The second via 208 connects the interconnect segment 206 to the destination trace 210. The destination trace 210 is shown on the same layer as the source trace 202 although it is understood that the source trace 202 and the destination trace 210 may be on different metal layers. The destination trace 210 is connected to an input buffer (not shown) as part of the designed circuit. The electrical parameters of the source device and the input buffer are known to the layout design tool 102.

For illustrative purpose, the current flow is shown in a single direction, although it is understood that the current flow may be in the opposite direction. Also for illustrative purpose, the source trace 202 and the destination trace 204 are shown as sourcing and receiving the current flow, respectively, although it is understood that the relative positions of the source trace 202 and the destination trace 204 may be switched for the opposite current flow.

Figure 3:
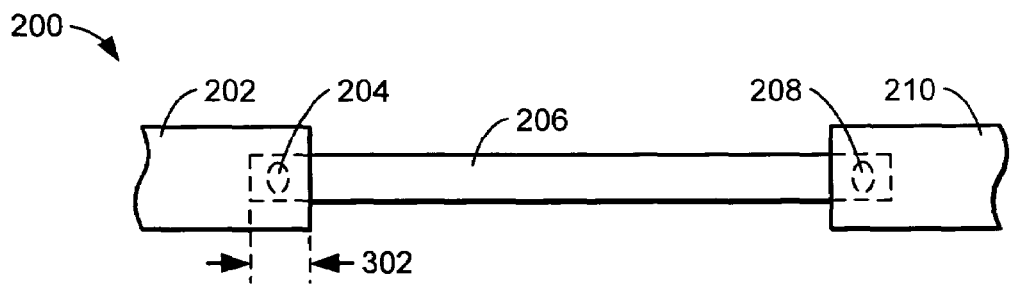
FIG. 3 is a plan view of the interconnect of FIG. 2.

Referring now to FIG. 3, therein is shown a plan view of the interconnect structure 200 of FIG. 2. The plan view depicts the interconnect structure 200 from above. The source trace 202 overlaps the interconnect segment 206. The first via 204 is placed such that it is substantially centered in the overlap area 302. The interconnect segment 206 is shown as narrower than the source trace 202, though it is understood that the relative width of the interconnect segment 206 to the source trace 202 may differ.

The interconnect segment 206 also overlaps with the destination trace 210. The second via 208 is placed such that it is substantially centered in the overlap space 302. The interconnect segment 206 is shown as narrower than the destination trace 210, though it is understood that the relative width of the interconnect segment 206 to the destination trace 210 may differ. It is further understood that the relative size, position and spacing of the source trace 202 and the destination trace 210 is for example only and may differ.

Figure 4:
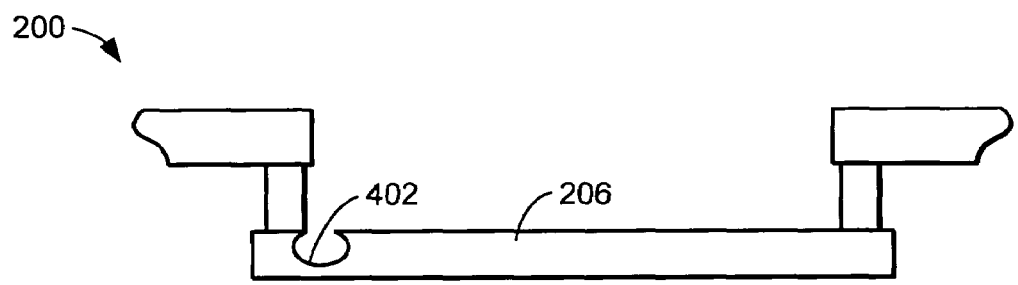
FIG. 4 is a cross-sectional view of the interconnect of FIG. 2, having developed an electromigration cavity.

Referring now to FIG. 4, therein is shown a cross-sectional view of the interconnect structure 200 of FIG. 2, having developed an electromigration cavity. The cross-sectional view of the interconnect structure 200 depicts an interconnect cavity 402 formed by electromigration of the interconnect segment 206 whose design was susceptible to electromigration failure. The interconnect cavity 402 is caused by the self diffusion of metallic ions (not shown) induced by an electric current. The metallic ions are pushed in the direction of current flow by the electron wind and pushed in the reverse direction by back stress.

In a short instance of the interconnect segment 206, the back stress can match or exceed the electron wind and no electromigration will occur. In longer interconnect segments, the effective volume of the interconnect segment 206 must be sufficiently large to reduce the current density in the interconnect segment 206 below the critical jL product in order to prevent the formation of the interconnect cavity 402. In instances where the current density allows the jL product to exceed the critical level, interconnect failure sites can form at the point of current density flux divergence.

The layout design tool 102 accepts the fixed values in an interconnect segment 206 and adjusts the remaining variables to mitigate the electromigration risk for the interconnect segment 206. The critical stress value for the interconnect segment 206 of the device are proportional to the Cu/cap adhesion energy and inversely proportional to the Young's Modulus of the surrounding interlayer dielectric.

Figure 5:
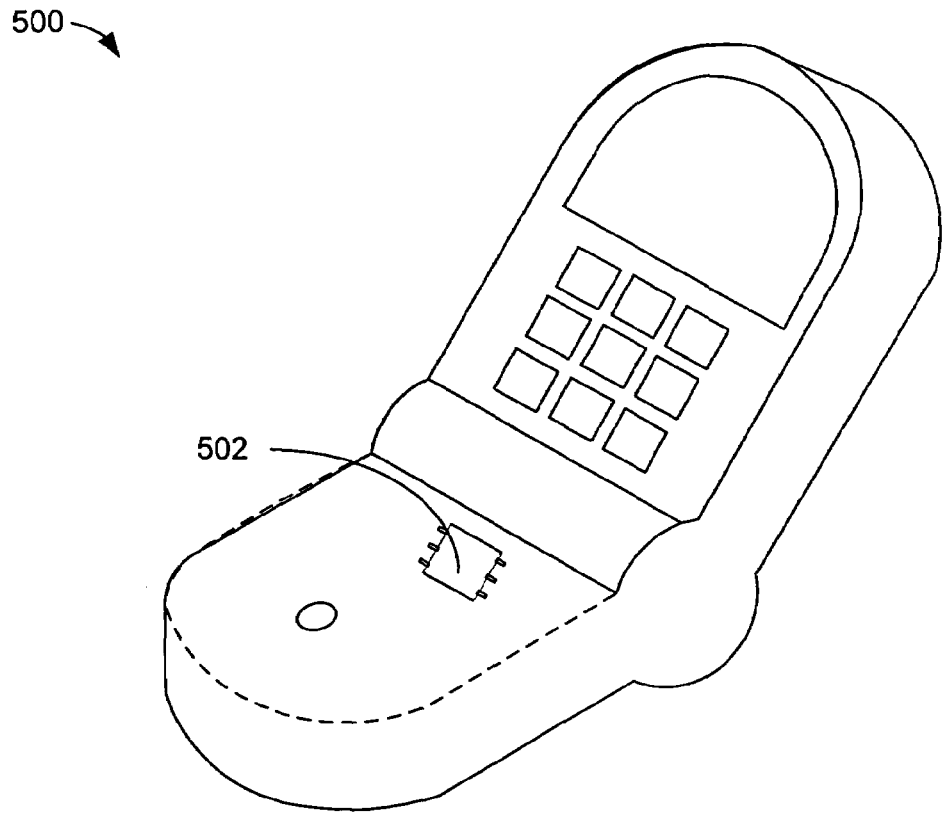
FIG. 5 is a plan view of an electronic device having an integrated circuit.

Referring now to FIG. 5, therein is shown a plan view of an electronic device 500 having an integrated circuit 502. The plan view of the electronic device 500, such as a cellular telephone, depicts the electronic device having the integrated circuit 502. The integrated circuit 502, such as a voltage converter, was designed using the integrated circuit design system 100, of FIG. 1, and fabricated per the technology database 110, of FIG. 1. As a critical component of the electronic device 500, the use of the integrated circuit design system 100 provides assurance that the integrated circuit 502 will not be impacted by electromigration failure during its expected lifetime.

Figure 6:
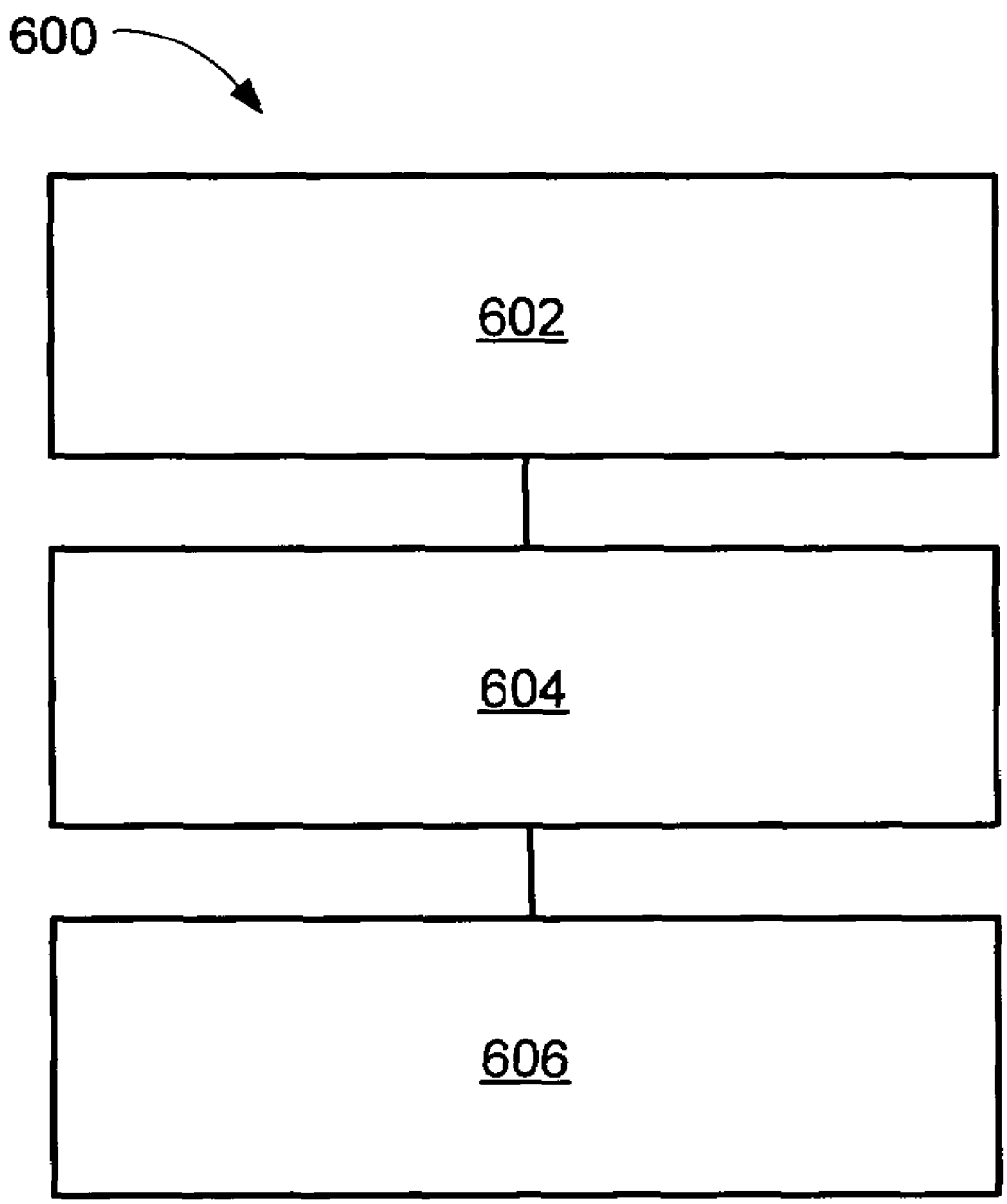
FIG. 6 is a flow chart of a system for integrated circuit design, in an embodiment of the present invention.

Referring now to FIG. 6, therein is shown a flow chart of a method for designing an integrated circuit 600 for the manufacture of the integrated circuit design system 100, in an embodiment of the present invention. The system 600 includes providing a design system in a computer system in a block 602; providing a layout design tool coupled to the design system, wherein the layout design tool creates an interconnect structure to satisfy electromigration criteria in a block 604; and manipulating a design database within the design system in a block 606.

In greater detail, a method to provide an electromigration design rule layout system, in an embodiment of the present invention, is performed as follows:

1. Providing a design system, wherein the design system includes a computer. (FIG. 1)
2. Providing a layout design tool attached to the design system, wherein the layout design tool creates an interconnect structure to satisfy electromigration criteria during the first layout. (FIG. 1) and
3. Manipulating a design database within the design system, including a physical netlist in the design database. (FIG. 1)

It has been discovered that the integrated circuit design system can deliver a more reliable integrated circuit design, while shortening the verification time of the integrated circuit design. The normal electromigration testing that is performed prior to general release of a product may consume in excess of 1000 hours of test time.

It has been discovered that the present invention thus has numerous aspects. An aspect is that the present invention prevents the failure of the interconnect structure, during the useful life of the integrated circuit, due to formation of cavities caused by electromigration.

Another aspect is the design of the integrated circuit may be completed sooner, due to the initial layout meeting electromigration requirements. It is far more difficult to retrofit a design to resolve electromigration weaknesses in the interconnect structure.

Yet another important aspect of the present invention is that it valuably supports and services the historical trend of reducing costs, simplifying systems, and increasing performance.

These and other valuable aspects of the present invention consequently further the state of the technology to at least the next level.

Thus, it has been discovered that the integrated circuit design system method and apparatus of the present invention furnish important and heretofore unknown and unavailable solutions, capabilities, and functional aspects for reliable integrated circuit design and fabrication. The resulting processes and configurations are straightforward, cost-effective, uncomplicated, highly versatile and effective, can be implemented by adapting known technologies, and are thus readily suited for efficiently and economically manufacturing integrated circuit devices that are fully compatible with conventional manufacturing processes and technologies.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations which fall within the scope of the included claims. All matters hithertofore set forth herein or shown in the accompanying drawings are to be interpreted in an illustrative and non-limiting sense.

What is claimed is:

1. A method for designing an integrated circuit comprising:
    providing a design system in a computer system;
    providing a layout design tool coupled to the design system for creating an interconnect structure to satisfy electromigration criteria;
    manipulating a design database within the design system; and
    analyzing a critical stress of the interconnect structure with the layout design tool.

2. The method as claimed in claim 1 further comprising:
    accessing a technology database to determine the electromigration criteria;
    providing a target wafer to fabricate an integrated circuit; and
    fabricating the integrated circuit on the target wafer.

3. The method as claimed in claim 1 further comprising modifying mechanical properties of the interconnect structure to adjust for electromigration criteria.

4. The method as claimed in claim 1 further comprising preventing an interconnect cavity by implementing with the layout design tool.

5. The method as claimed in claim 1 further comprising adjusting an interconnect segment volume to reduce a current density.

6. A method for designing an integrated circuit comprising:
    providing a design system, in which the design system includes a computer system;
    providing a layout design tool coupled to the design system for creating an interconnect structure to satisfy electromigration criteria during a first layout;
    manipulating a design database within the design system, including a physical netlist in the design database; arid
    analyzing a critical stress of the interconnect structure with the layout design tool.

7. The method as claimed in claim 6 further comprising:
    accessing a technology database to determine the electromigration criteria, including an adhesion energy of a Cu/cap interface in the technology database;
    providing a target wafer to fabricate an integrated circuit, in which the integrated circuit can be released without lengthy electromigration testing procedures; and
    fabricating the integrated circuit on the target wafer, including using the integrated circuit in an electronic device.

8. The method as claimed in claim 6 further comprising modifying mechanical properties of the interconnect structure to adjust for electromigration criteria.

9. The method as claimed in claim 6 further comprising preventing an interconnect cavity by implementing with the layout design tool.

10. The method as claimed in claim 6 further comprising adjusting an interconnect segment volume to reduce a current density.

11. An integrated circuit design system comprising:
a computer system;
a design system in the computer system;
a layout design tool coupled to the design system, in which the layout design tool creates an interconnect structure to satisfy electromigration criteria by analyzing a critical stress of the interconnect structure; and
a design database manipulated within the design system.

12. The integrated circuit design system as claimed in claim 11 further comprises:
a technology database accessed to determine the electromigration criteria;
a target wafer to fabricate an integrated circuit; and
the integrated circuit fabricated on the target wafer.

13. The integrated circuit design system as claimed in claim 11 further comprises a mechanical property of the interconnect structure adjusted for electromigration criteria.

14. The integrated circuit design system as claimed in claim 11 further comprises an interconnect cavity prevented by the layout design tool.

15. The integrated circuit design system as claimed in claim 11 further comprises an interconnect segment volume adjusted to reduce a current density.

16. The integrated circuit design system as claimed in claim 11 wherein:
the design system in the computer system,
the layout design tool attached to the design system, creates an interconnect structure to satisfy electromigration criteria, and
the design database manipulated within the design system;
further comprising:
a computer included in the design system;
a first layout satisfies the electromigration criteria; and
a physical net list included in the design database.

17. The integrated circuit design system as claimed in claim 16 further comprising:
a technology database accessed to determine the electromigration criteria, includes an adhesion energy of a Cu/cap interface in the technology database;
a target wafer to fabricate an integrated circuit, wherein the integrated circuit can be released without lengthy electromigration testing procedures; and
the integrated circuit fabricated on the target wafer, including the integrated circuit used in an electronic device.

18. The integrated circuit design system as claimed in claim 16 further comprising a mechanical property of the interconnect structure adjusted for electromigration criteria.

19. The system integrated circuit design as claimed in claim 16 further comprising an interconnect cavity prevented by the layout design tool.

20. The integrated circuit design system as claimed in claim 16 further comprising an interconnect segment volume adjusted to reduce a current density.

* * * * *